(12) United States Patent
Archibald et al.

(10) Patent No.: US 8,827,547 B2
(45) Date of Patent: Sep. 9, 2014

(54) FLUID DISTRIBUTION METHOD FACILITATING COOLING OF ELECTRONICS RACK(S) AND SIMULATING HEATED AIRFLOW EXHAUST OF ELECTRONICS RACK(S)

(71) Applicant: International Business Machines Corporation, Armonk, NY (US)

(72) Inventors: Matthew R. Archibald, Morrisville, NC (US); Richard C. Chu, Hopewell Junction, NY (US); Hendrik Hamann, Yorktown Heights, NY (US); Madhusudan K. Iyengar, Foster City, CA (US); Roger R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/795,030

(22) Filed: Mar. 12, 2013

(65) Prior Publication Data

US 2013/0191096 A1 Jul. 25, 2013

Related U.S. Application Data

(60) Division of application No. 12/887,551, filed on Sep. 22, 2010, now Pat. No. 8,439,561, which is a continuation of application No. 11/950,758, filed on Dec. 5, 2007, now Pat. No. 7,832,925.

(51) Int. Cl.
*G01K 1/12* (2006.01)
*G01K 1/16* (2006.01)
*G01K 13/10* (2006.01)
*G01K 17/06* (2006.01)

(52) U.S. Cl.
USPC ...... 374/5; 703/9; 702/130; 374/29; 374/137; 374/134; 374/109; 374/135; 165/287

(58) Field of Classification Search
USPC ............. 374/1, 4, 5, 57, 45, 29, 137, 134, 30, 374/170, 152, 141, 178, 135; 703/9, 3; 324/500, 537, 750.01, 750.03; 165/108, 287; 702/130, 132, 133, 134, 702/135, 136, 99; 136/203, 204, 290; 717/113, 300; 700/278, 282; 361/701, 361/689
See application file for complete search history.

(56) References Cited

U.S. PATENT DOCUMENTS 3,916,638 A 11/1975 Schmidt
(Continued)

FOREIGN PATENT DOCUMENTS

JP 09273967 A * 10/1997

OTHER PUBLICATIONS

Sharma et al., "Balance of Power: Dynamic Thermal Management for Internet Data Center", Internet Systems and Storage Laboratory, HP Laboratories, Palo Alto, California (Feb. 18, 2003).

(Continued)

*Primary Examiner* — Gail Verbitsky
(74) *Attorney, Agent, or Firm* — Dennis Jung, Esq.; Kevin P. Radigan, Esq.; Heslin Rothenberg Farley & Mesiti P.C.

(57) ABSTRACT

Apparatus and method are provided for facilitating simulation of heated airflow exhaust of an electronics subsystem, electronics rack or row of electronics racks. The apparatus includes a thermal simulator, which includes an air-moving device and a fluid-to-air heat exchanger. The air-moving device establishes airflow from an air inlet to air outlet side of the thermal simulator tailored to correlate to heated airflow exhaust of the electronics subsystem, rack or row of racks being simulated. The fluid-to-air heat exchanger heats airflow through the thermal simulator, with temperature of airflow exhausting from the simulator being tailored to correlate to temperature of the heated airflow exhaust of the electronics subsystem, rack or row of racks being simulated. The apparatus further includes a fluid distribution apparatus, which includes a fluid distribution unit disposed separate from the fluid simulator and providing hot fluid to the fluid-to-air heat exchanger of the thermal simulator.

5 Claims, 9 Drawing Sheets

(56) References Cited

U.S. PATENT DOCUMENTS

| | | | |
|---|---|---|---|
| 4,097,723 A * | 6/1978 | Leitner et al. | 219/494 |
| 4,312,188 A * | 1/1982 | Swenson et al. | 62/160 |
| 4,473,110 A | 9/1984 | Zawierucha | |
| 4,613,952 A * | 9/1986 | McClanahan | 703/6 |
| 4,681,744 A | 7/1987 | Weitman | |
| 5,002,226 A | 3/1991 | Nelson | |
| 5,289,872 A | 3/1994 | Kent | |
| 6,146,882 A | 11/2000 | Uematsu et al. | |
| 6,751,958 B1 * | 6/2004 | Wright et al. | 60/649 |
| 6,775,137 B2 | 8/2004 | Chu et al. | |
| 6,819,563 B1 | 11/2004 | Chu et al. | |
| 6,868,682 B2 | 3/2005 | Sharma et al. | |
| 7,170,745 B2 | 1/2007 | Bash et al. | |
| 7,237,406 B2 | 7/2007 | Voss et al. | |
| 7,255,474 B2 | 8/2007 | Cong et al. | |
| 7,311,264 B2 | 12/2007 | Franke et al. | |
| 7,315,448 B1 | 1/2008 | Bash et al. | |
| 7,633,181 B2 * | 12/2009 | Gross et al. | 307/68 |
| 7,644,051 B1 * | 1/2010 | Moore et al. | 706/21 |
| 7,657,347 B2 | 2/2010 | Campbell et al. | |
| 7,698,114 B2 | 4/2010 | Hamann et al. | |
| 7,726,144 B2 | 6/2010 | Larson et al. | |
| 7,739,073 B2 | 6/2010 | Hamann et al. | |
| 7,832,925 B2 | 11/2010 | Archibald et al. | |
| 7,963,119 B2 | 6/2011 | Campbell et al. | |
| 7,979,250 B2 | 7/2011 | Archibald et al. | |
| 8,184,436 B2 | 5/2012 | Campbell et al. | |
| 8,197,124 B2 | 6/2012 | Claassen et al. | |
| 8,297,069 B2 | 10/2012 | Novotny et al. | |
| 8,305,757 B2 | 11/2012 | Keisling et al. | |
| 8,327,656 B2 | 12/2012 | Tutunoglu et al. | |
| 2003/0067745 A1 | 4/2003 | Patel et al. | |
| 2003/0210525 A1 * | 11/2003 | Chung et al. | 361/695 |
| 2004/0218355 A1 | 11/2004 | Bash et al. | |
| 2005/0122685 A1 | 6/2005 | Chu et al. | |
| 2005/0236145 A1 | 10/2005 | Arai et al. | |
| 2006/0036417 A1 | 2/2006 | Wu et al. | |
| 2006/0097337 A1 * | 5/2006 | Haji-Sheikh et al. | 257/462 |
| 2006/0121421 A1 | 6/2006 | Spitaels et al. | |
| 2006/0232945 A1 | 10/2006 | Chu et al. | |
| 2006/0265609 A1 | 11/2006 | Fung | |
| 2007/0032979 A1 | 2/2007 | Hamann et al. | |
| 2007/0091566 A1 * | 4/2007 | Sun | 361/695 |
| 2007/0291817 A1 | 12/2007 | Bradicich et al. | |
| 2008/0154534 A1 | 6/2008 | Bash et al. | |
| 2008/0209931 A1 | 9/2008 | Stevens | |
| 2008/0281551 A1 | 11/2008 | Hamann et al. | |
| 2008/0300818 A1 | 12/2008 | Brey et al. | |
| 2009/0112522 A1 | 4/2009 | Rasmussen | |
| 2009/0150123 A1 | 6/2009 | Archibald et al. | |
| 2009/0150133 A1 | 6/2009 | Archibald et al. | |
| 2009/0207880 A1 | 8/2009 | Ahladas et al. | |
| 2010/0107658 A1 | 5/2010 | Cockrell | |
| 2010/0293529 A1 * | 11/2010 | Austin et al. | 717/113 |
| 2010/0293591 A1 * | 11/2010 | Shah | 726/1 |
| 2011/0010151 A1 | 1/2011 | Archibald et al. | |
| 2011/0057803 A1 | 3/2011 | Yamaoka et al. | |
| 2011/0105010 A1 * | 5/2011 | Day | 454/184 |
| 2011/0265983 A1 | 11/2011 | Pedersen | |
| 2013/0062047 A1 * | 3/2013 | Vaney et al. | 165/287 |
| 2013/0253898 A1 * | 9/2013 | Meagher et al. | 703/18 |

OTHER PUBLICATIONS

Schmidt, Roger R., "Thermal Profile of a High-Density Data Center—Methodology to Thermally Characterize a Data Center", ASHRAE Transactions: Symposia, NA-04-4-2 (2004).

Schmidt et al., "Thermal Profile of a High-Density Data Center: Hot Spot Heat Fluxes of 512 W/ft2", ASHRAE Transactions, vol. 111, Part 2, pp. 1-13, DE-05-11-6 (2005).

Schmidt et al., "Best Practices for Data Center Thermal Management—Review of Literature", ASHRAE Transactions, vol. 113, Part 1, pp. 1-13, DA-07-022 (2006).

Schmidt et al., "Thermal Profile of World's 3rd Fastest Supercomputer—IBM's ASC Purple Cluster", ASHRAE Summer Annual Meeting (Jun. 21-25, 2006).

"High Performance Data Centers: A Design Guidelines Sourcebook", Pacific Gas & Electric (PG&E) White Paper, Pacific Gas & Electric Company, Berkeley National Laboratory for PG&E (2006).

Claassen et al., "Techniques for Analyzing Data Center Energy Utilization Practices", U.S. Appl. No. 11/750,325, filed May 17, 2007.

Archibald et al., Notice of Allowance for U.S. Appl. No. 11/950,758, filed Dec. 5, 2007 (U.S. Patent No. 7,832,925 B2), dated Jul. 9, 2010.

Archibald et al., Office Action issued for U.S. Appl. No. 11/950,735, filed Dec. 5, 2007, (U.S. Patent Publication No. 2009/0150133 A1), dated Aug. 20, 2010.

Archibald et al., Final Office Action for U.S. Appl. No. 11/950,735, filed Dec. 5, 2007, (U.S. Patent Publication No. 200910150133 A1), dated May 6, 2011.

Archibald et al., Office Action for U.S. Appl. No. 11/950,735, filed Dec. 5, 2007 (U.S. Patent Publication No. 200910150133 A1), dated Aug. 23, 2012.

Archibald et al., Notice of Allowance for U.S. Appl. No. 11/950,735, filed Dec. 5, 2007, (U.S. Patent Publication No. 20090150133 A1), dated Feb. 5, 2013.

Archibald et al., Office Action issued for U.S. Appl. No. 11/950,747, filed Dec. 5, 2007, (U.S. Patent Publication No. 2009/0150123 A1), dated Sep. 30, 2010.

Archibald et al., Notice of Allowance for U.S. Appl. No. 11/950,747, filed Dec. 5, 2007 (U.S. Patent No. 7,979,250 B2), dated Mar. 3, 2011.

Archibald et al., Office Action for U.S. Appl. No. 12/887,551, filed Sep. 22, 2010 (U.S. Patent Publication No. 2011/0010151 A1), dated Jul. 31, 2012.

Archibald et al., Notice of Allowance for U.S. Appl. No. 12/887,551, filed Sep. 22, 2010 (U.S. Patent Publication No. 20110010151A1), dated Jan. 9, 2013.

* cited by examiner

FLUID DISTRIBUTION METHOD FACILITATING COOLING OF ELECTRONICS RACK(S) AND SIMULATING HEATED AIRFLOW EXHAUST OF ELECTRONICS RACK(S)

CROSS REFERENCE TO RELATED APPLICATIONS

This application is a divisional of U.S. Ser. No. 12/887,551, filed Sep. 22, 2010, and entitled "Fluid Distribution Apparatus and Method Facilitating Cooling of Electronics Rack(s) and Simulating Heated Airflow Exhaust of Electronics Rack(s)", published Jan. 13, 2011 as U.S. Patent Publication No. 2011-0010151 A1, which claims priority to U.S. Ser. No. 11/950,758, entitled "Apparatus And Method For Simulating Heated Airflow Exhaust Of An Electronics Subsystem, Electronics Rack Or Row Of Electronics Racks," filed Dec. 5, 2007, issued Nov. 16, 2010, as U.S. letters U.S. Pat. No. 7,832,925, each of which are hereby incorporated herein by reference in their entirety.

BACKGROUND

The present invention relates in general apparatuses and methods for facilitating thermal analysis of a data center, and more particularly, to apparatuses and methods for thermally simulating one or more respective electronics subsystems, electronics racks or rows of electronics racks to be disposed within a data center.

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic at the rack level in the context of a computer installation (e.g., data center).

The sensible heat load carried by the air exiting the rack is stressing the ability of the room air conditioning to effectively handle the load. This is especially true for large installations with "server farms" or large banks of computer racks close together. In such installations not only will the room air conditioning be challenged, but the situation may also result in recirculation problems with some fraction of the "hot" air exiting one rack unit being drawn into the air inlet of the same rack or a nearby rack. This recirculation flow is often extremely complex in nature, and can lead to significantly higher rack inlet temperatures than expected. This increase in cooling air temperature may result in components exceeding their allowable operating temperature or in a reduction in long term reliability of the components.

Addressing thermal imbalances within a data center is often an expensive and time consuming operation. Therefore, there is a need in the art for apparatuses and methods which facilitate thermal and energy based design, analysis and optimization of electronics equipment of a data center.

BRIEF SUMMARY

The shortcomings of the prior art are overcome and additional advantages are provided through the provision of a method of supplying fluid to a data center. The method includes: obtaining a hybrid, dual-function fluid distribution unit comprising a hot fluid distribution sub-unit and a coolant distribution sub-unit; and employing the hybrid, dual-function fluid distribution unit in a heating mode or a cooling mode, wherein when employed in the heating mode, hot fluid is provided by the hot fluid distribution sub-unit of the hybrid, dual-function fluid distribution unit to at least one thermal simulator for facilitating simulation of heated airflow exhaust of a respective electronics subsystem, electronics rack or row of electronics racks, and when employed in the cooling mode, the coolant distribution sub-unit provides chilled fluid to facilitate cooling of at least one electronics rack.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 3A is an enlarged view of one rack thermal simulator of the plurality of rack thermal simulators of FIG. 3, in accordance with an aspect of the present invention;

DETAILED DESCRIPTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. An electronics rack comprises at least one electronics subsystem. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack. As used herein, a "thermal simulator" lacks the electronics subsystem or electronics subsystems of (for example) the electronics rack to be simulated.

In addition, "data center" refers to a computer installation to contain one or more electronics racks to be cooled. As a specific example, a data center may be designed to contain one or more rows of rack-mounted computing units, such as server units. Further, as used herein, "fluid-to-air heat exchanger" means any heat exchange mechanism characterized as described herein through which fluid can circulate; and includes, one or more discrete fluid-to-air heat exchangers coupled either in-series or in parallel. A fluid-to-air heat exchanger may comprise, for example, one or more fluid flow paths, formed of thermally conductive tubing (such as copper or other tubing) in thermal communication with (in one example) a plurality of thermally conductive fins. Size, configuration and construction of the fluid-to-air heat exchanger can vary without departing from the scope of the invention disclosed herein.

One example of the hot fluid discussed below is water. However, the concepts disclosed herein are readily adapted to use with other types of fluid. For example, a dielectric liquid, a fluorocarbon liquid, a fluoroinert liquid, a liquid metal, a brine, steam, flue gas, combustion-related gas, or other similar fluid may be employed, while still maintaining the advantages and unique features of the present invention.

Reference is made below to the drawings, which are not drawn to scale for reasons of understanding, wherein the same reference numbers used throughout different figures designate the same or similar components.

Figure 1:
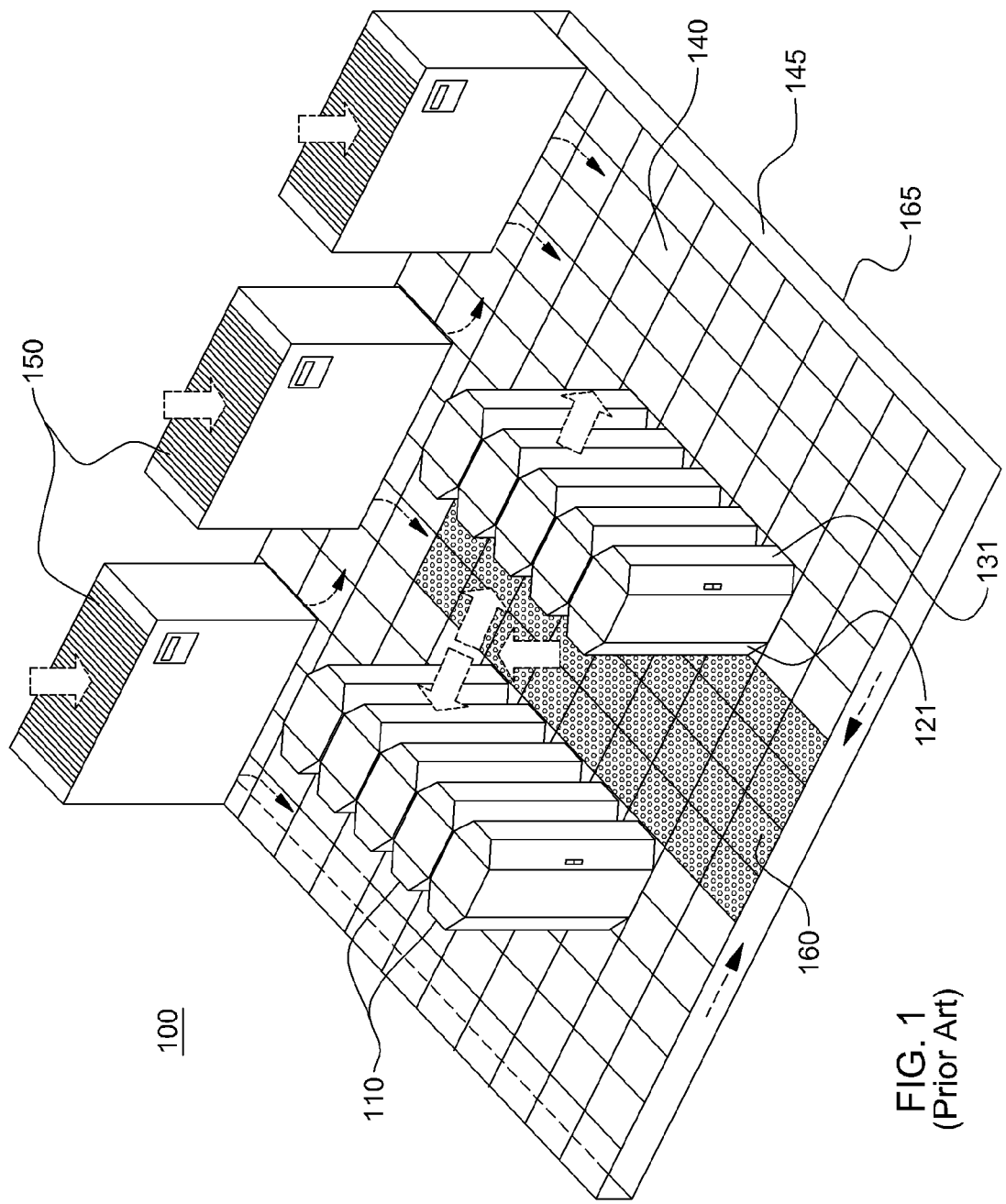
FIG. 1 depicts one embodiment of a conventional raised floor layout of an air-cooled data center.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered air inlet doors 121 of the electronics racks and expelled through louvered air outlet doors 131 of the electronics racks. Each electronics rack 110 may have an air moving device (e.g., fan or blower) to provide forced inlet-to-outlet air flow to cool the electronic components within the electronics subsystem(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more air-conditioning units 150, also disposed within data center 100. Room air is taken into each air-conditioning unit 150 near an upper portion thereof. This room air often comprises (in part) exhausted air from the "hot" air aisles of the data center disposed adjacent to air outlet sides of the electronics racks 110.

Limiting factors for cooling an air-cooled data center, such as data center 100 in FIG. 1, are related to the maximum chilled airflow rate that can be supplied from a single perforated tile, the maximum cooling capability of the air-conditioning units within the data center, and the hot air recirculation phenomenon that is common in such data centers. Hot air recirculation occurs when the total flow rate of supplied chilled air in front of an electronics rack is less than the total airflow rate through the electronics rack, leading to the hot exhaust from one electronics rack being drawn into the intake of the same or another electronics rack, thus resulting in potentially unacceptably high air inlet temperatures. This can impact the reliability and performance of the electronics within the rack, and lead to device failure in extreme cases.

Typically, data center thermal issues are addressed using one of two approaches. In the first approach, a human expert and some degree of trial and error are employed to make changes in the data center by changing layout of, for example, the perforated tiles, the electronics racks, the air-conditioning units, room geometry (ceiling, walls, partitions, ducts, types of tiles), or by changing the operating point of the air-conditioning units (air or liquid flow rates, set point temperatures). Alternatively, a computer-based technique to model the data center may be employed to simulate several "what if?" scenarios, followed by a plan for making actual changes in the data center layout to improve cooling of the electronics racks.

There are two dominant problems with computer-based modeling techniques. The first is the difficulty in obtaining accurate model input information. While it is difficult to obtain accurate model input information of server racks, it is even more difficult to obtain accurate input information before installation. Such input can include the detailed physical description of the above and under-floor parts of a data center, rack power and rack flow information, tile airflow rates, and tile air temperature (which can vary), to name a few. Computer-based models also require a number of assumptions. For example, computer-based models usually assume that there is no draft or air blowing across the room from various poorly sealed boundaries of the room, and they assume that there is no escape route for air in the under-floor plenum perimeter where some cold air could, in reality, "disappear". Also, electronics racks are typically represented as perfectly rectangular units with uniform airflow and uniform heat dissipation profiles, which is often not the case.

Another problem with computer-based modeling techniques is the inherent inaccuracies arising from physics-based assumptions that are made to construct the model. These assumptions are embedded in the solver engine of the modeling tool. One example might be the use of a certain turbulence model to characterize the flow physics which would bring with it several assumptions. While such a turbulence model might be applied globally, it might only work well for certain spatial areas of the data center. Another example could be the assumption that natural convection (or buoyancy-driven flow) contributes very little to the temperature gradients in the room. Yet another assumption could be the use of fluid properties which do not vary with temperature. Such assumptions can contribute to differences between model results in air temperatures versus actual measurement data, even when the model inputs are very accurate and detailed.

Therefore, actual installation and a certain degree of trial and error are believed necessary to attain an optimized data center layout. After installation, however, it is often difficult and costly to change one or more design parameters of the data center, such as the position and number of air-conditioning units, or the layout of the electronics racks. Thus, presented herein are apparatuses and methods which address this problem of trial and error installation optimization.

Figure 2:
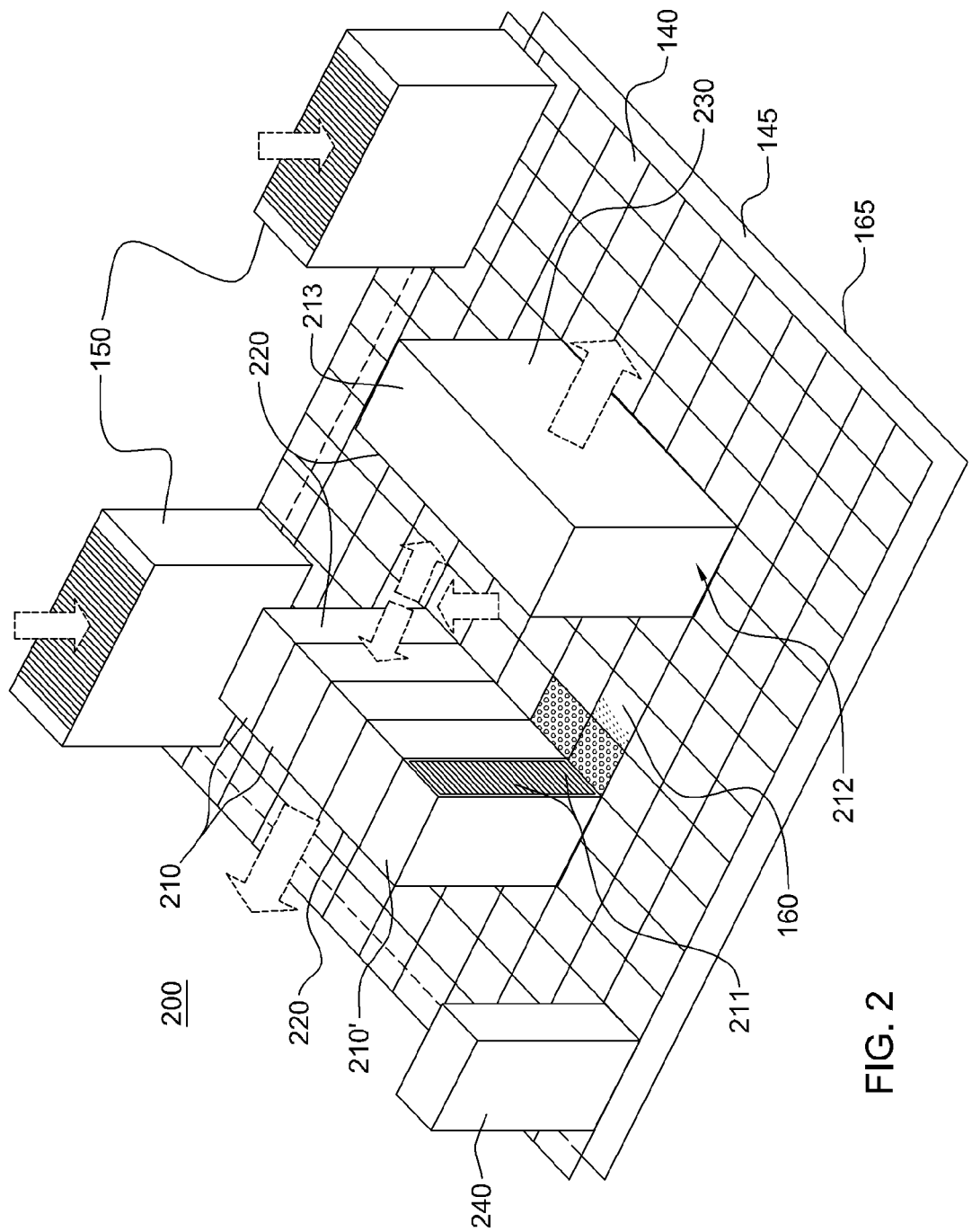
FIG. 2 depicts one embodiment of a data center layout with a plurality of thermal simulators, a hot fluid distribution unit and multiple air-conditioning units, in accordance with an aspect of the present invention.

FIG. 2 illustrates one embodiment of a data center layout, generally denoted 200, comprising a plurality of thermal simulators (in accordance with an aspect of the present invention). These thermal simulators include rack thermal simulators 210, electronics subsystem (or node level) thermal simulators 211 (disposed, for example, in rack thermal simulator 210'), and row thermal simulator 212, which simulates exhausted airflow from an entire row of electronics racks. In one embodiment, a one to one correlation is assumed between the location of the thermal simulators in FIG. 2 and the location of electronics racks 110 in data center layout 100 of FIG. 1. In this regard, note that row thermal simulator 212 simulates an entire row of electronics racks illustrated in FIG. 1. That is, row thermal simulator 212 is constructed to simulate heated airflow exhaust from multiple electronics racks disposed in a row.

In one embodiment, row thermal simulator 212 includes an outer housing 213 and at least one vertical partition (not shown) therein defining different airflow columns through housing 213. Each airflow column essentially simulates airflow through a respective electronics rack of the row of electronics racks. As will be understood from the following discussion, row thermal simulator 212 further includes one or more air-moving devices for establishing airflow from an air inlet side to an air outlet side thereof, wherein the established airflow exhausting from the airflow columns is tailored to correlate to heated airflow exhaust of the respective electronics racks in the row. The row thermal simulator further includes one or more fluid-to-air heat exchangers (such as the fluid-to-air heat exchangers discussed hereinbelow). The fluid-to-air heat exchanger(s) heat airflow exhausting from the row thermal simulator to tailor temperature of the airflow exhausted from the airflow columns thereof to correlate to temperature of heated airflow exhaust from the respective electronics racks in the row of electronics racks being simulated.

In general, each thermal simulator is constructed to simulate a rate of airflow exhausting from a respective electronics subsystem, electronics rack or row of electronics racks, as well as the thermal characteristics of the airflow. As described further below, one or more hot fluid distribution units 240 provide hot fluid to the fluid-to-air heat exchangers of the thermal simulators, for example, via appropriate fluid supply and return headers disposed, in one embodiment, between raised floor 140 and base floor 165 of the room. Chilled air enters the computer room via floor vents 160 from supply air plenum 145, and is taken in through the air inlet sides 220 of the respective thermal simulators and expelled through the air outlet sides 230 thereof. Conditioned and cooled air is supplied to plenum 145 by one or more air-conditioning units 150, also disposed within the data center. Room air is taken into each air-conditioning unit 150 near an upper portion thereof. This room air comprises in part exhausted air from the "hot" air aisle of the data center at the air outlet sides of the thermal simulators.

Figure 3:
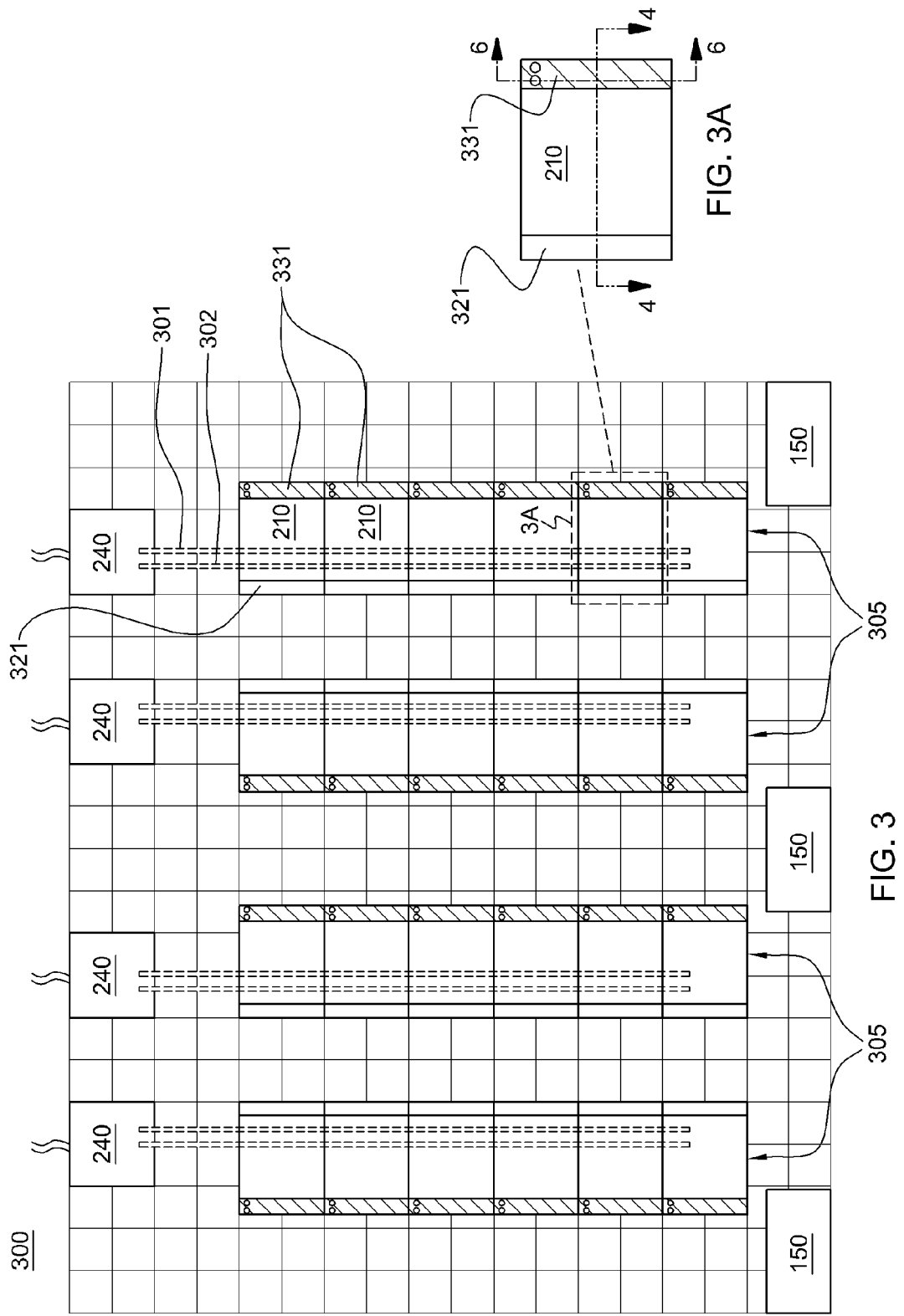
FIG. 3 depicts an alternate embodiment of a data center layout with a plurality of rack thermal simulators, multiple fluid distribution units, and multiple air-conditioning units, in accordance with an aspect of the present invention.

FIG. 3 depicts an alternate data center layout, generally denoted 300, containing a plurality of rack thermal simulators 210 (in accordance with an aspect of the present invention). In this embodiment, multiple rows 305 of rack thermal simulators 210 are provided, with each row having a respective hot fluid distribution unit 240 connected thereto via a fluid supply header 301 and a fluid return header 302 running, in one embodiment, under the raised floor of the data center. Multiple computer room air-conditioning units 150 are also shown disposed within data center layout 300.

FIG. 3A depicts an enlarged view of one rack thermal simulator 210. As shown, rack thermal simulator 210 includes an inlet door 321 and an outlet door 331. In one embodiment, inlet door 321 is hingedly connected along one edge to rack thermal simulator 210 at the air inlet side thereof, and outlet door 331 is hingedly connected along one edge to rack thermal simulator 210 at the air outlet side thereof.

Figure 4:
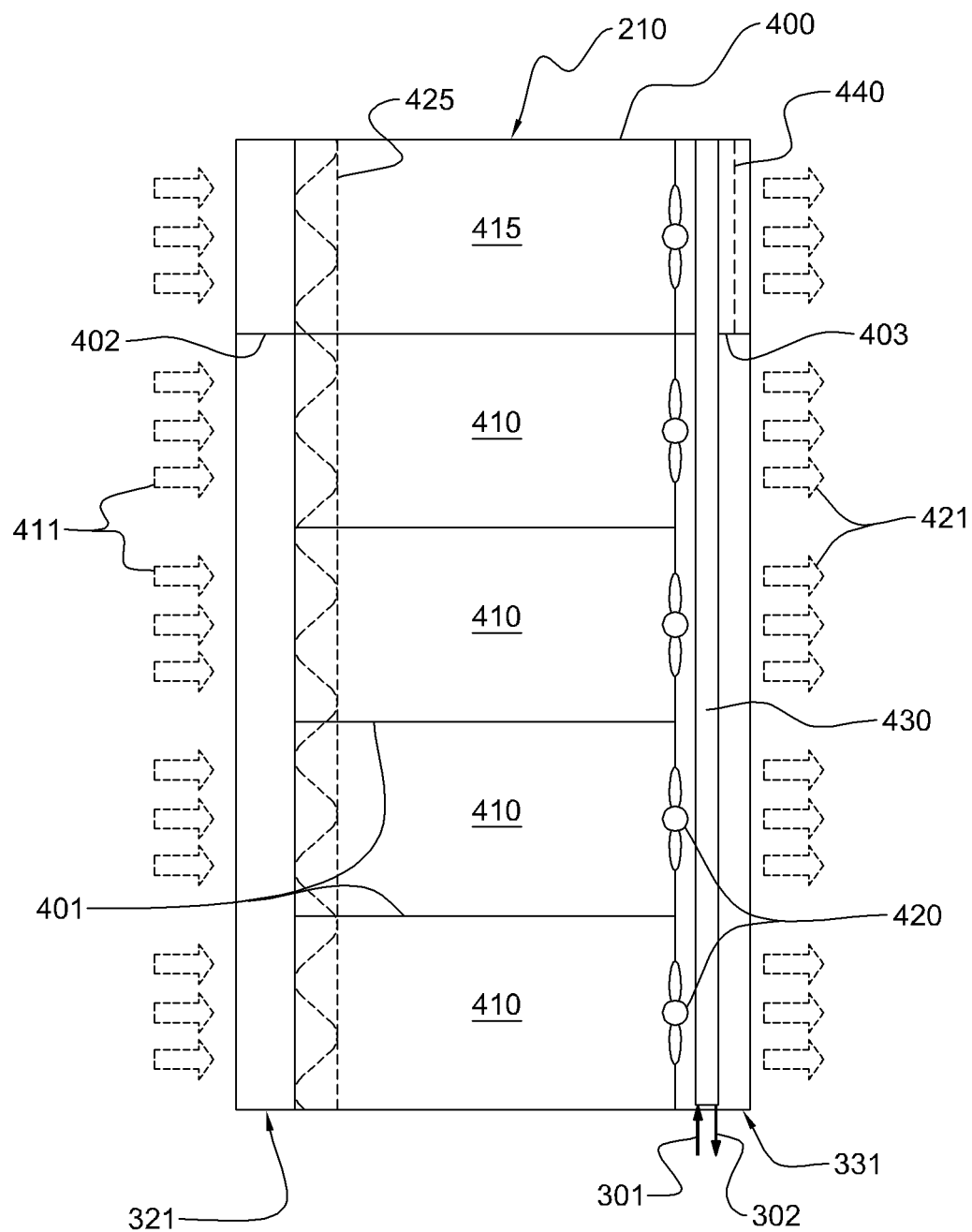
FIG. 4 is a cross-sectional elevational view of the rack thermal simulator of FIG. 3A, taken along line 4-4, in accordance with an aspect of the present invention.

FIG. 4 is a cross-sectional elevational view of the rack thermal simulator 210 of FIG. 3A, taken along line 4-4. As shown, rack thermal simulator 210 includes a rack frame 400 with multiple, horizontally-oriented flow partition plates 401 dividing the rack frame into multiple subsections 410, 415. Each subsection is sized to correspond to an electronics subsystem of the respective electronics rack being thermally simulated. In this example, one subsection 415 is isolated from the other subsections 410, with airflow into and from subsection 415 being isolated from airflow into and from the remaining subsections 410. This is accomplished using a front flow partitioning plate 402 and a back flow partitioning plate 403 disposed or extending into inlet door 321 and outlet door 331, respectively.

Multiple air-moving devices 420 draw external air 411 through inlet door 321 and the respective subsections 410, 415 of rack frame 400 for expelling out through outlet door 331 as airflow exhaust 421. In one example, each subsection 410, 415 includes one or more air-moving devices 420, and the air-moving devices are separately controllable so that airflow through the respective subsections can be tailored to simulate airflow through the corresponding electronics subsystems of the respective electronics rack being simulated. Each subsection may include an airflow impedance filter 425 tailored to establish an airflow impedance through rack thermal simulator 210 correlated to the airflow impedance through the respective electronics rack being simulated. More particularly, by providing horizontally-oriented flow partitioning plates 401, 402 & 403, airflow impedance filters 425, and air-moving devices 420, airflow through the respective subsections of rack thermal simulator 210 can be tailored to mirror airflow through the corresponding electronics subsystems of the electronics rack being simulated.

One or more flow profile plates 440 may also be used in rack thermal simulator 210 to configure the airflow exhaust 421 from one or more subsections 415, 410 of the simulator. This allows a more realistic simulation of the airflow exhaust from the corresponding electronics subsystems of the electronics rack being simulated.

Figure 5:
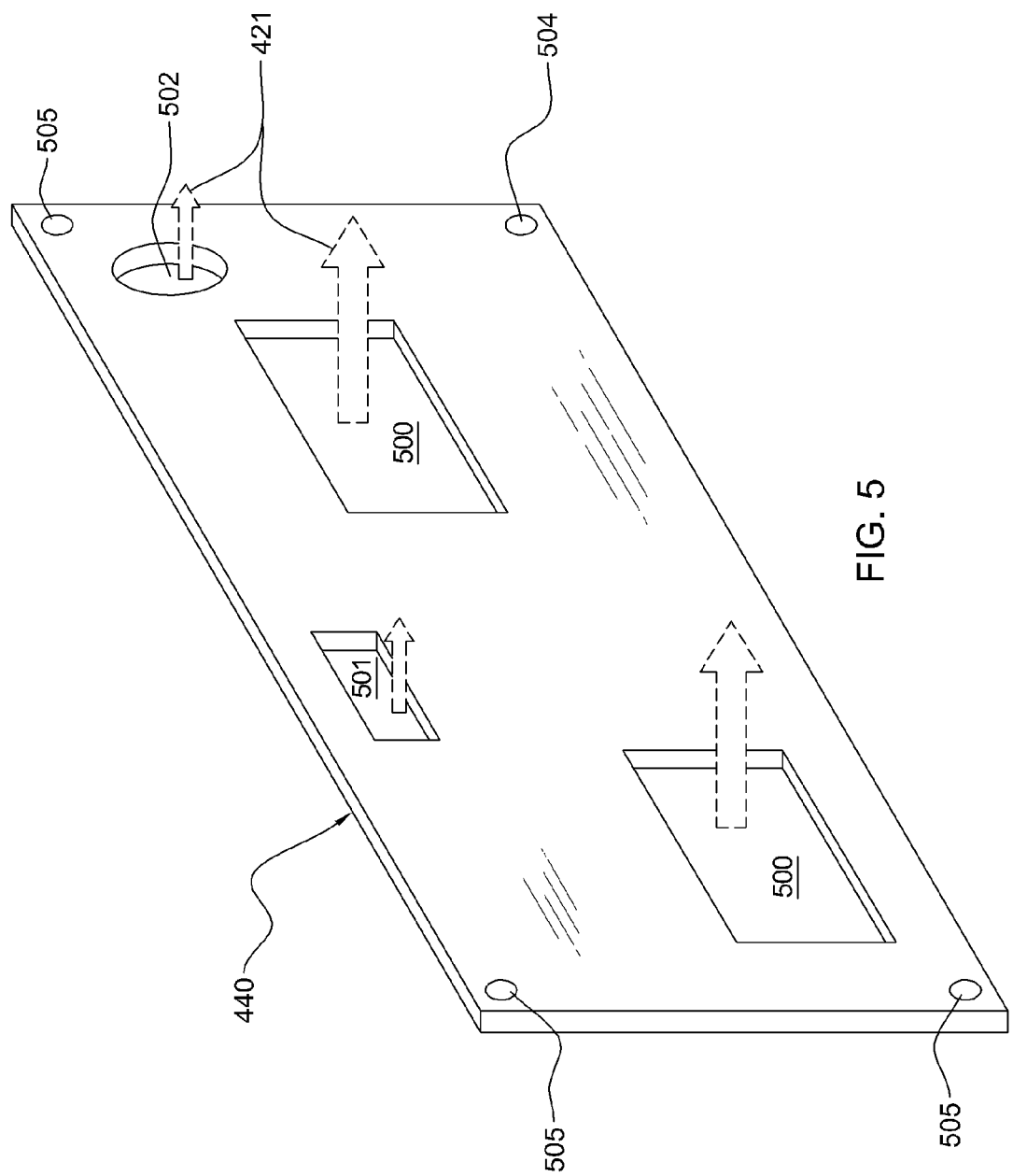
FIG. 5 is an isometric view of one embodiment of a flow profile plate used in the rack thermal simulator of FIG. 4, in accordance with an aspect of the present invention.

FIG. 5 depicts one embodiment of flow profile plate 440 wherein a plurality of airflow openings include rectangular openings 500, 501, and circular opening 502. Further, openings 505 facilitating securing of the plate to the thermal simulator, for example, using bolts (not shown). The different configurations and sizes to the openings allow tailoring of the airflow exhaust 421 profile. The particular flow profile plate 440 which may be desirable thus depends upon a characterization of the airflow exhaust from the corresponding electronics subsystem or electronics rack being simulated. Although shown as tailoring airflow exhaust from a particular subsection, it should be noted that each subsection within rack thermal simulator 210 could have associated therewith a respective flow profile plate, or a single flow profile plate could be employed across multiple subsections of rack thermal simulator 210.

As shown in FIG. 4, rack thermal simulator 210 further includes a fluid-to-air heat exchanger 430 disposed, for example, within outlet door 331, for heating air exhausting from the rack thermal simulator. Air exhausting from rack thermal simulator 210 is heated by the fluid-to-air heat exchanger to a temperature which is tailored to simulate a temperature of heated airflow exhaust of the respective electronics rack being simulated. Hot fluid is provided to fluid-to-air heat exchanger 430 via fluid supply header 301 and fluid return header 302.

Figure 6:
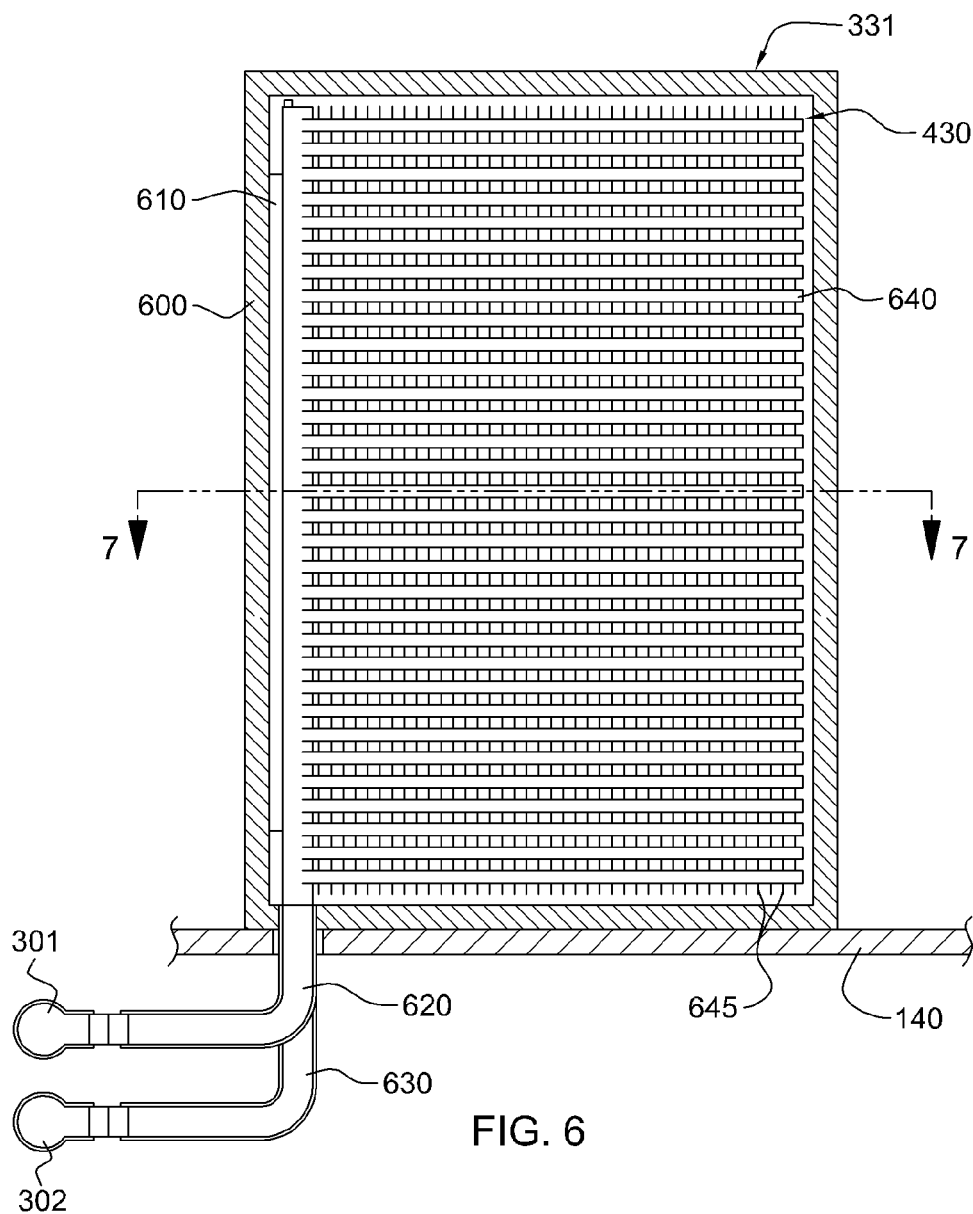
FIG. 6 is a cross-sectional elevational view of the rack thermal simulator of FIG. 3A, taken along line 6-6, in accordance with an aspect of the present invention.
Figure 7:
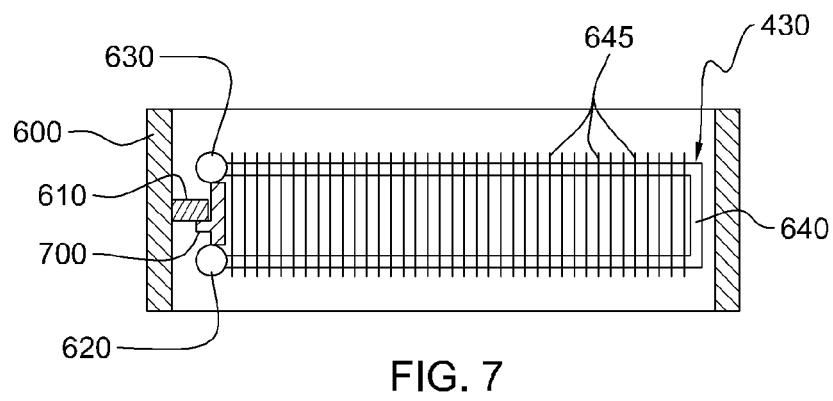
FIG. 7 is a cross-sectional plan view of the structure of FIG. 6, taken along line 7-7, in accordance with an aspect of the present invention.

FIG. 6 is a cross-sectional elevational view of the structure of FIG. 3A, along line 6-6 through outlet door 331 and fluid-to-air heat exchanger 430 supported thereby, while FIG. 7 is a cross-sectional plan view of the structure illustrating fluid inlet and outlet plenums 620, 630, respectively, of the fluid-to-air heat exchanger. Referring to both figures collectively, outlet door 331 is illustrated above raised floor 140 and includes an outlet door frame 600 which supports a rigid flap 610, attached (for example) by welding, brazing or soldering, to a plate 700 secured between fluid inlet plenum 620 and fluid outlet plenum 630. In one embodiment, fluid inlet plenum 620 receives (via appropriate connection to fluid supply header 301) hot fluid from a respective hot fluid distribution unit 240 (see FIG. 3). Fluid outlet plenum 630 exhausts lukewarm fluid to fluid return header 302 for return to the respective hot fluid distribution unit 240 (FIG. 3).

In the embodiment illustrated in FIGS. 6 & 7, fluid-to-air heat exchanger 430 includes a plurality of horizontally-oriented heat exchange tube sections 640. These heat exchange tube sections 640 each comprise a fluid channel having an inlet and an outlet, with each fluid channel inlet being coupled to fluid inlet plenum 620, and each fluid outlet channel being coupled to fluid outlet plenum 630. A plurality of fins 645, which in one embodiment are vertically-oriented, rectangular fins, are attached to the horizontally-oriented heat exchange tube sections 640 to facilitate transfer of heat from hot fluid passing through the fluid channels to air flowing across the fluid-to-air heat exchanger, thereby causing heated air to be exhausted from the heat exchanger, and hence from the rack thermal simulator. Again, the rack thermal simulator is tailored so that heated air exhausting therefrom simulates (i.e., correlates to the amount and temperature of) hot air exhausting from the respective electronics rack being simulated. For example, laboratory testing of the respective electronics rack is performed to obtain operational flow rate and temperature data on the heated air exhausting from the electronics rack, which is then used to tailor the rack thermal simulator to simulate the operating electronics rack. Further, although described herein with reference to simulating an operating electronics rack, the thermal simulator could alternatively be constructed to simulate an electronics subsystem, or a row of electronics racks, as noted above in connection with FIG. 2.

By way of further explanation, the airflow rate generated by each air-moving device of the rack thermal simulator illustrated in FIGS. 3A-7 can be manipulated (in one embodiment) via an associated variable frequency drive device connected to the air-moving device. Based on actual knowledge of airflow rate for the electronics rack being simulated, the airflow rate through the rack thermal simulator can be manually or automatically set to a specific value. Manual setting of airflow rate can take place using an appropriate manual interface to a control unit (not shown) coupled to the rack thermal simulator and the variable frequency drive devices. Power dissipation of each rack thermal simulator could also be adjusted via the control unit by manipulating the rate of hot fluid flow supplied to the rack thermal simulator. Such a valve-based mechanism would reside, in one embodiment, with the under-floor headers of the fluid distribution apparatus. The hot fluid temperature leaving the hot fluid distribution unit and its total flow rate is assumed to be controlled by the hot fluid distribution unit. In the embodiment of FIGS. 3-7, where one hot fluid distribution unit provides hot fluid to six rack thermal simulators, using parallel plumbing, each rack thermal simulator receives the same fluid flow rate at the same temperature. By using valves at the rack thermal simulator or at the fluid distribution apparatus, flow rate of hot fluid to specific rack thermal simulators can be adjusted. The use of series-parallel piping arrangements can yield different temperatures to different rack thermal simulators. A larger fluid flow rate or higher temperature of fluid entering the heat exchanger of one rack thermal simulator results in a higher heat dissipation rate, and thus, greater power consumption being simulated.

In general, the monolithic apparatuses disclosed herein are advantageously used in installations which possess a degree of homogeneity. By employing a single fluid distribution unit hot fluid can be provided to multiple thermal simulators, therefore reducing the energy which would otherwise be expended in heating the fluid. Further, the rack thermal simulators disclosed herein can be readily converted from a simulation mode to actual electronics racks containing one or more electronics subsystems to be cooled.

Figure 8:
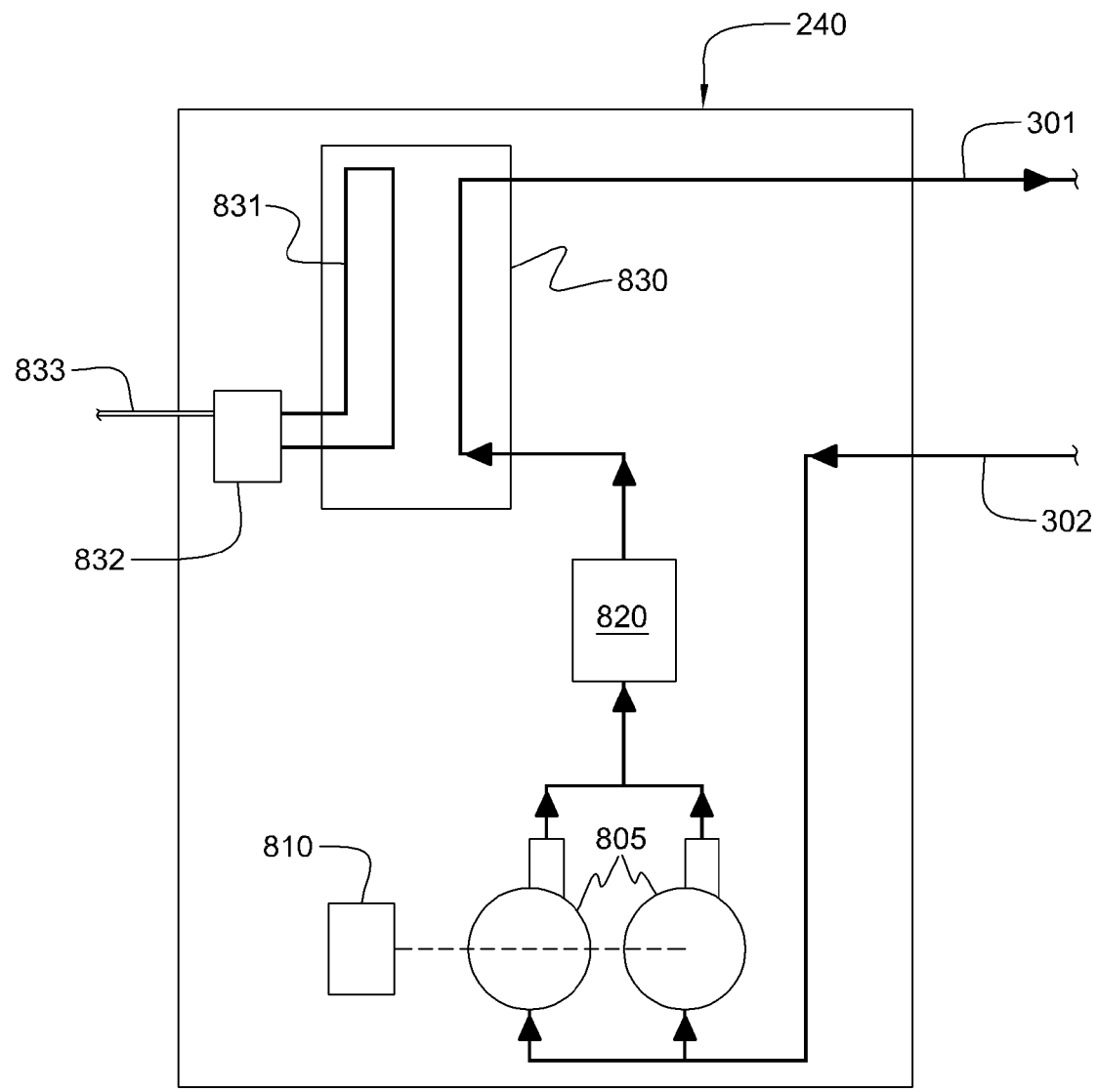
FIG. 8 is a schematic of one embodiment of a hot fluid distribution unit, in accordance with an aspect of the present invention.

FIG. 8 depicts one embodiment of a hot fluid distribution unit 240, in accordance with an aspect of the present invention. As shown, hot fluid distribution unit 240 is coupled to a respective fluid supply header 301 and to a respective fluid return header 302 for supplying hot fluid to multiple thermal simulators disposed within a data center layout, such as depicted in FIG. 3. Fluid is pumped employing a redundant pump assembly 805 into and through a fluid reservoir 820. A variable frequency drive device 810 is coupled to redundant pump assembly 805 to control the flow rate of fluid being pumped through hot fluid distribution unit 240. By varying the flow rate, it is possible to affect change in the amount of heat being dissipated by the respective fluid-to-air heat exchangers of the thermal simulators, and hence, temperature of the airflow exhausting from the thermal simulators. A fluid heater 830 includes (in one embodiment) an electrical resistance heater coil 831, and a power supply 832, which is electrically powered 833, and which sets the total power being dissipated by electrical resistance heater coil 831, and hence, sets the temperature of the hot fluid exiting fluid heater 830 for distribution to the thermal simulators.

Figure 9:
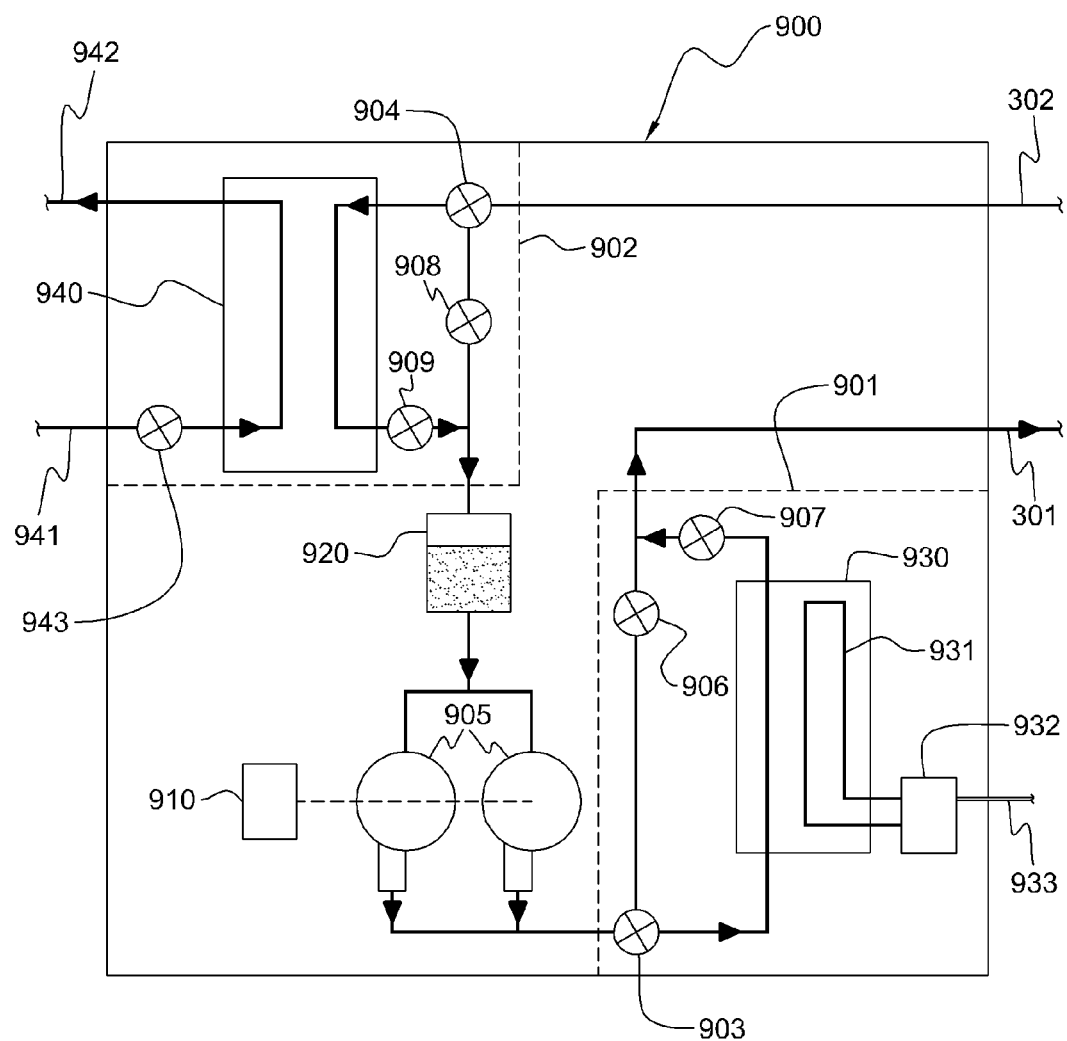
FIG. 9 is a schematic of one embodiment of a hybrid, dual-function fluid distribution unit, in accordance with an aspect of the present invention.

FIG. 9 depicts one embodiment of a hybrid, dual-function fluid distribution unit 900, which is an alternative apparatus to the hot fluid distribution unit depicted in FIG. 8. As shown in FIG. 9, the hybrid, dual-function fluid distribution unit 900 includes a hot fluid distribution sub-unit 901 and a coolant distribution sub-unit 902. Hot fluid distribution sub-unit 901 and coolant distribution sub-unit 902 share a redundant pump assembly 905 and a fluid reservoir 920. In the embodiment illustrated, redundant pump assembly 905 is controlled by a variable frequency drive device 910 that allows variation in flow rate of hot fluid or chilled fluid, depending upon whether the hybrid, dual-function fluid distribution unit is in heating mode or cooling mode.

In heating mode, a bypass valve 904 is actuated to direct fluid from fluid return header 302 through a one-way valve 908 into fluid reservoir 920, while a second bypass valve 903 directs fluid from redundant pump assembly 905 into fluid heater 930 of hot fluid distribution sub-unit 901. Fluid heater 930 includes electrical resistance heater coils 931, which are powered by a variable power supply 932, which itself is electrically powered 933. Hot fluid exits fluid heater 930, passes through a one-way valve 907, for output via fluid supply header 301 to one or more thermal simulators, such as described above. One-way valve 906 prevents hot fluid from circulating back to bypass valve 903. Similarly, in the heating mode, one-way valve 909 prevents fluid passing through one-way valve 908 from circulating into a liquid-to-liquid heat exchanger 940 of coolant distribution sub-unit 902.

In cooling mode, bypass valve 904 is actuated to direct fluid from fluid return header 302 into liquid-to-liquid heat exchanger 940. In this mode, heat is removed from the fluid, and transferred, for example, to facility coolant passing through a facility coolant supply line 941 and facility coolant return line 942. A control valve 943 is provided within facility coolant supply line 941 to control the amount of facility coolant passing through liquid-to-liquid heat exchanger 940, and hence, the amount of cooling applied to the fluid being circulated back to the electronics rack. The chilled fluid exits liquid-to-liquid heat exchanger 940 through one-way valve 909, and is directed into fluid reservoir 920 via one-way valve 908. From fluid reservoir 920, the fluid is pumped though bypass valve 903 and one-way valve 906 for output to fluid supply header 301.

Figure 10:
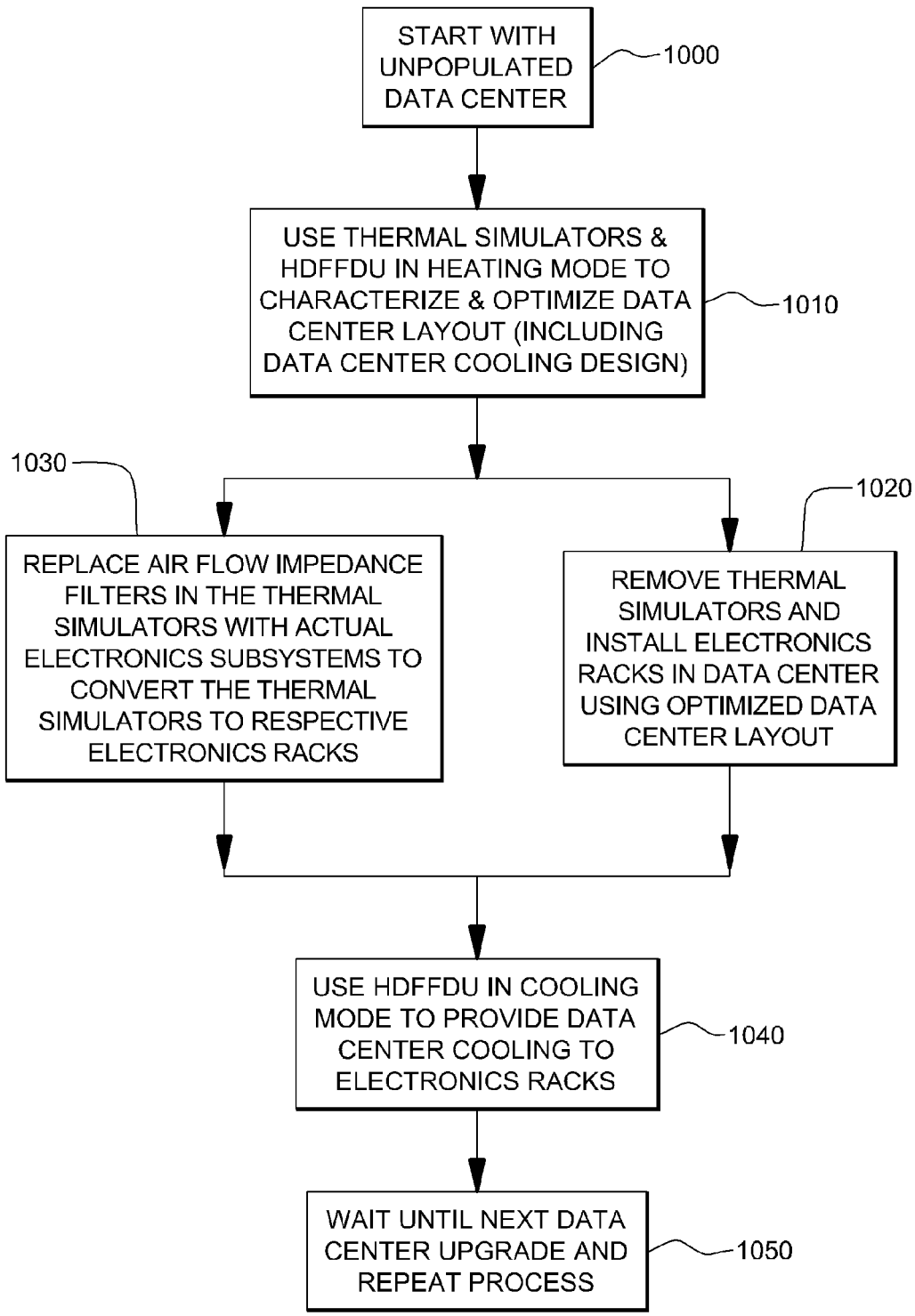
FIG. 10 is a flowchart of one embodiment of a process for using a plurality of rack thermal simulators and a hybrid, dual-function fluid distribution unit in a data center, and thereafter for using the hybrid, dual-function fluid distribution unit to facilitate cooling of a plurality of electronics racks in the data center, in accordance with an aspect of the present invention.

FIG. 10 is a flowchart of one process for analyzing a data center layout, and subsequently cooling electronics racks, using a hybrid, dual-function fluid distribution unit, such as depicted in FIG. 9. The process begins with an unpopulated data center 1000, which is to contain electronics racks pursuant to a simulated data center layout. Thermal simulators, such as the rack thermal simulators described herein, are employed along with the hybrid, dual-function fluid distribution unit in heating mode to characterize and optimize a data center layout (including a data center cooling design) 1010. After the data center layout has been optimized, the thermal simulators are removed from the data center and the respective electronics racks are installed in the data center using the optimized data center layout 1020. Alternatively, the rack frames of the thermal simulators could be employed as rack frames for the respective electronics racks by replacing the airflow impedance filters of the thermal simulators with actual electronics subsystems, thereby converting the thermal simulators into the respective electronics racks 1030. The hybrid, dual-function fluid distribution unit (HDFFDU) is then employed in cooling mode to provide data center cooling to the electronics racks 1040, and processing waits until a next data center upgrade, for which the simulation process is repeated to optimize the new data center layout.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of supplying fluid to a data center, the method comprising:

obtaining a hybrid, dual-function fluid distribution unit comprising a hot fluid distribution sub-unit and a coolant distribution sub-unit, wherein in a heating mode of the hybrid, dual-function fluid distribution unit, the hot fluid distribution sub-unit provides hot fluid, and in a cooling mode of the hybrid-dual-function fluid distribution unit, the coolant distribution sub-unit provides chilled fluid; and employing the hybrid, dual-function fluid distribution unit in selectively providing the hot fluid to at least one thermal simulator for a respective electronics subsystem, electronics rack, or row of electronics racks of the data center, and the chilled fluid to the respective electronics subsystem, electronics rack, or row of electronics racks, wherein in the heating mode, the hot fluid is provided by the hot fluid distribution sub-unit of the hybrid, dual-function fluid distribution unit to the at least one thermal simulator for facilitating physical simulation of heated airflow exhaust from said respective electronics subsystem, electronics rack or row of electronics racks, and in the cooling mode, the chilled fluid is provided by the coolant distribution sub-unit of the hybrid, dual-function fluid distribution to the respective electronics subsystems, electronics rack or row of electronics racks to facilitate cooling thereof.

2. The method of claim 1, wherein the employing comprises switching the hybrid, dual-function fluid distribution unit from the heating mode to the cooling mode after simulating heated airflow exhaust from the respective electronics subsystem, electronics rack or row of electronics racks, wherein the simulating facilitates analysis of a data center layout.

3. The method of claim 2, wherein switching the hybrid, dual-function fluid distribution unit from the heating mode to the cooling mode further comprises switching of fluid flow from the hot fluid distribution sub-unit to the coolant distribution sub-unit.

4. The method of claim 1, further comprising employing, in the heating mode and the cooling mode, a common fluid within the hybrid, dual-function fluid distribution unit, wherein when in the heating mode, the common fluid is heated by the hot fluid distribution sub-unit, and when in the cooling mode, the common fluid is cooled by the coolant distribution sub-unit.

5. The method of claim 1, wherein the hot fluid is a hot liquid, and the chilled fluid is a chilled liquid.

* * * * *